United States Patent
Tanzawa et al.

(10) Patent No.: US 6,734,719 B2
(45) Date of Patent: May 11, 2004

(54) CONSTANT VOLTAGE GENERATION CIRCUIT AND SEMICONDUCTOR MEMORY DEVICE

(75) Inventors: Toru Tanzawa, Ebina (JP); Yoshinori Takano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/238,773

(22) Filed: Sep. 11, 2002

(65) Prior Publication Data

US 2003/0048684 A1 Mar. 13, 2003

(30) Foreign Application Priority Data

Sep. 13, 2001 (JP) .......................................... 2001-278460

(51) Int. Cl.[7] ................................................. G05F 1/10
(52) U.S. Cl. .......................... 327/541; 327/543; 323/315
(58) Field of Search ................................. 327/538, 540, 327/541, 543; 323/312, 313, 315; 36/589.01, 203, 196, 267

(56) References Cited

U.S. PATENT DOCUMENTS

| | | | | |
|---|---|---|---|---|
| 4,342,926 A | * | 8/1982 | Whatley | 327/541 |
| 4,769,589 A | * | 9/1988 | Rosenthal | 323/313 |
| 5,109,187 A | * | 4/1992 | Guliani | 365/185.21 |
| 5,748,533 A | * | 5/1998 | Dunlap et al. | 365/185.19 |
| 5,818,294 A | * | 10/1998 | Ashmore, Jr. | 327/543 |
| 5,881,015 A | * | 3/1999 | Kim | 365/229 |
| 6,160,393 A | * | 12/2000 | Ahn et al. | 323/315 |
| 6,184,745 B1 | * | 2/2001 | Kim | 327/541 |
| 6,275,417 B1 | * | 8/2001 | Lee et al. | 365/185.19 |
| 6,392,394 B1 | * | 5/2002 | Nakagawa et al. | 323/315 |
| 6,441,680 B1 | * | 8/2002 | Leung et al. | 327/541 |
| 6,518,833 B2 | * | 2/2003 | Narendra et al. | 327/541 |

FOREIGN PATENT DOCUMENTS

JP 2000-353394 12/2000

OTHER PUBLICATIONS

Toru Tanazawa, et al., "Design of a Sense Circuit for Low–Voltage Flash Memories", IEEE Journal of Solid-State Circuits, vol., 35, No. 10, Oct. 2000, pp. 1415–1421.

* cited by examiner

Primary Examiner—Terry D. Cunningham
(74) Attorney, Agent, or Firm—Oblon, Spivak, McClelland, Maier & Neustadt, P.C.

(57) ABSTRACT

A constant voltage generating circuit comprising following elements is shown:

a first constant current generation circuit including a first transistor and a second transistor, configured to generate a first voltage and a first current as determined by an operating point to be determined depending on a difference in threshold voltage between the first and second transistors;

a second constant current generation circuit configured to generate a second current proportional to said first current; and a voltage generation circuit including a third transistor having its gate and drain connected together, configured to generate a second voltage when letting said second current flow in said third transistor.

12 Claims, 8 Drawing Sheets

FIG. 1A
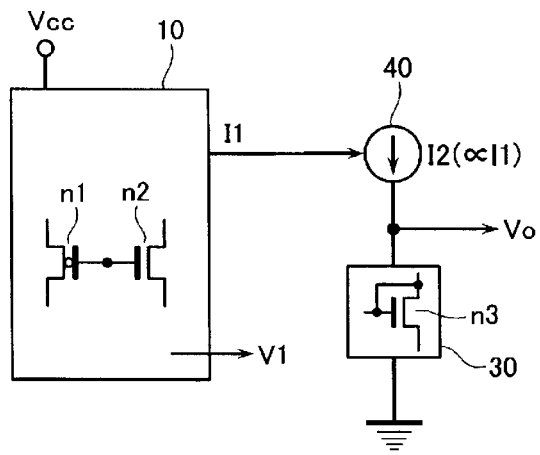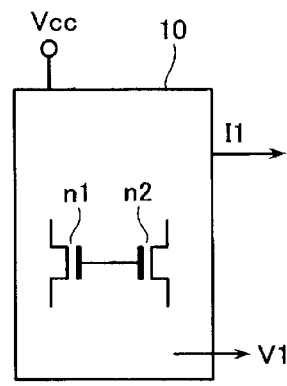
FIG. 1F
FIG. 1B
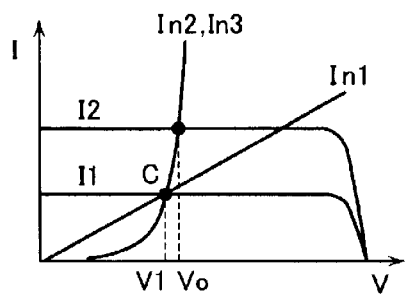
FIG. 1C
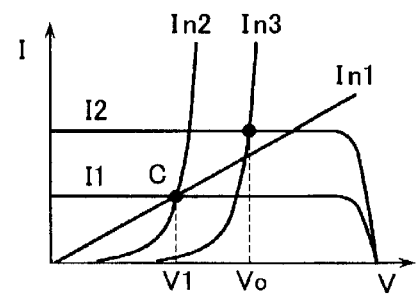
FIG. 1D
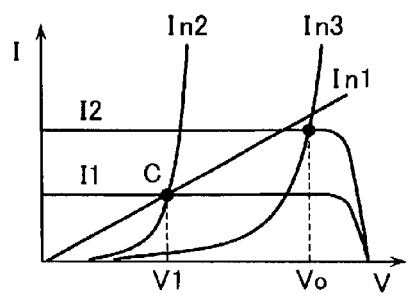
FIG. 1E
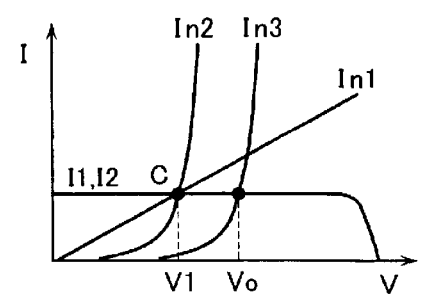

CONSTANT VOLTAGE GENERATION CIRCUIT AND SEMICONDUCTOR MEMORY DEVICE

CROSS-REFERENCE TO PRIOR APPLICATION

This application is based upon and claims the benefit of priority from the prior Japanese Patent Application No. 2001-278460, filed on Sep. 13, 2001, the entire content of which is incorporated herein by reference.

FIELD OF THE INVENTION

The present invention relates generally to voltage generating circuitry adaptable for use in semiconductor integrated circuit devices and, more particularly, to a constant voltage generation circuit capable of generating a high output voltage even upon occurrence of a potential decrease in power supply voltage.

DESCRIPTION OF THE RELATED ART

FIG. 9A is a diagram showing one typical prior known constant voltage generation circuit. This constant voltage generation circuit 1 is equipped with a constant current generator circuit 10 of the so-called Wilson type which functions to output a constant-level voltage and a switching circuit 20 operable to switch between its active state and inactive state.

The Wilson type constant current generator circuit 10 is generally configured from a p-channel metal oxide semiconductor (pMOS) transistor p1 of the enhancement type (E-type) which has a standard threshold voltage (Vtp) with a negative value, an E-type pMOS transistor p2 which is the same in size as the transistor p1, an E-type n-channel MOS (nMOS) transistor n1 having a low threshold voltage Vtn1, and an E-type nMOS transistor n2 having its threshold voltage Vtn2 higher than this Vtn1 value.

The transistor p1 is diode-connected—that is, its drain and gate are connected together. The language "diode-connected" will be used hereinafter in the same technical meaning. The transistors p1 and p2 have gates coupled together, thereby making up a current mirror circuit. The nMOS transistor n1 and a resistor 11 are connected between the drain of this transistor p1 and ground voltage Vss, thus forming a first current flow path 12. This resistor 11 has a resistance value R1, which is larger than the turn-on resistance of the nMOS transistor n1.

The nMOS transistor n2 and a switching transistor 24 of a switching circuit 20 as will be later described are connected between the drain of transistor p2 and ground voltage Vss to thereby form a second current flow path 13. The transistor n1's gate is connected to the gate and drain of the transistor n2. A potential NBIAS at the drain of this transistor n2 is for use as an output voltage Vo of the constant voltage generation circuit 1.

The switching circuit 20 is constituted from a switching pMOS transistor 21, a switching nMOS transistor 22, an inverter 23, and a switching nMOS transistor 24. The pMOS transistor 21 is connected between the source of pMOS transistor p1 and a power supply voltage Vcc. In responding to receipt of an enable signal ENB such as shown in FIG. 9B, the transistor 21 performs a switching operation to go from its turn-on state to turn-off state, whereby the first current flow path 12 made up of the pMOS transistor p1 and nMOS transistor n1 turns on. Note here that although a pMOS transistor 25 which has the same characteristics as the switching pMOS transistor 21 is connected on the pMOS transistor p2 side also, this is merely for the purpose of equalizing potential levels at the sources of the both transistors p1, p2. Transistor 25 is coupled to ground at its gate. Thus, transistor 25 is always kept conductive—i.e. turns on in any events.

The nMOS transistor 24 is disposed between the source of nMOS transistor n2 and ground voltage Vss and is designed to switch from its turn-off to turn-on state in response to receipt of the enable signal ENB. Whereby, the second current flow path 13 made up of the pMOS transistor p2 and nMOS transistor n2 turns on. The switching nMOS transistor 22 is the one that is operatively responsive to receipt of the enable signal ENB for performing reset and set-up of a connection node O1.

An operation of the circuitry of FIG. 9A is as follows. Upon receiving of the enable signal ENB, the switching circuit 20 causes the Wilson constant current generator circuit 10 to switch from its inactive state to active state. Due to the current mirror connection of the transistors p1, p2, a current Ip2 which flows between the source and drain of pMOS transistor p2 becomes equal to a current Ip1 flowing between the source and drain of pMOS transistor p1. These currents Ip1, Ip2 flow into the nMOS transistors n1, n2, respectively, thereby becoming currents In1, In2. Thus, In1 and In2 also are equal to each other. As the resistance value R1 of resistor 11 is made larger than the turn-on resistance of nMOS transistor n1, the current versus voltage characteristics of the current flow path 12 is representable by straight line "A" (with a gradient of 1/R1) shown in a graph of FIG. 9C, wherein line A crosses the lateral axis of this graph at a value Vtn1. On the other hand, the current-voltage characteristics of the current flow path 13 may be represented by exponential curve "B" with intercept Vtn2 on the lateral axis. The output voltage Vo of the constant voltage generation circuit 1 is determinable by a cross point C (operating point) of the characteristic line A and curve B owing to the functionality of the current mirror connection of transistors p1, p2; thus, it becomes a constant voltage without any potential dependency on the power supply voltage Vcc—say, Vcc-independent constant voltage. Additionally, curve D is plotted in FIG. 9C to indicate the transistor p1's load curve whereas curve E indicates a drain current Ip2 of the transistor p2 and its load curve.

Unfortunately the constant voltage generation circuit shown in FIG. 9 is encountered with a problem which follows. In cases where the supply voltage Vcc potentially decreases or drops down in accordance with the scaling of on-chip circuit elements, it is difficult to guarantee provision of the output voltage required. More specifically, in the constant voltage generation circuit of FIG. 9, the minimum value Vccmin of the supply voltage Vcc for operation stability is determined by the first current flow path 12 and is given as follows:

$$Vccmin = Vo - Vtn1 + |Vtp| + dVds1, \qquad \text{[Formula 1]}$$

where dvds1 is the drain-source voltage of transistor p1.

As can be seen from Formula 1, the only approach to reducing Vccmin while maintaining the output voltage Vo at the required potential level is to lower the threshold voltage Vtp.

This approach, however, does not come without accompanying a problem as to an increase in production costs due to the necessity for "special" channel implantation processes. Consequently, the prior art circuitry suffers from a problem that Vccmin reduction is hardly achievable without lowering the output voltage Vo per se.

SUMMARY OF THE INVENTION

The present invention may provide a constant voltage generating circuit in accordance with a first aspect thereof, which comprises a first constant current generation circuit which includes a first transistor and a second transistor and generates a first voltage and a first current as determined depending on a difference in threshold voltage between the first and second transistors, a second constant current generation circuit configured to generate a second current that is proportional to the first current, and a voltage generation circuit which includes a third transistor having its gate and drain connected together and which generates a second voltage when the second current flows in the third transistor.

The present invention may provide a constant voltage generating circuit in accordance with a second aspect thereof, which comprises a first constant current generation circuit which includes a first transistor and a second transistor and generates a first voltage and a first current as determined depending on a difference in transcondunctance between the first and second transistors, a second constant current generation circuit configured to generate a second current that is proportional to the first current, and a voltage generation circuit which includes a third transistor having its gate and drain connected together and which generates a second voltage when the second current flows in the third transistor.

A constant voltage generating circuit in accordance with a third aspect of this invention comprises a first current flow path, a second current flow path and a third current flow path. The first current path includes a serial combination of a diode-coupled first metal insulator semiconductor (MIS) transistor of a first conductivity type, a second MIS transistor of a second conductivity type, and a first resistor. The second current path includes a serial combination of a third MIS transistor of the first conductivity type as current mirror-connected to the first MIS transistor and a diode-coupled fourth MIS transistor of the second conductivity type. The third current path includes a fifth MIS transistor of the first conductivity type as current mirror-connected to the first MIS transistor. The second and fourth MIS transistors have their gates connected together. The third current path is operatively associated with a constant voltage output unit as connected thereto. This unit includes a diode-coupled sixth MIS transistor that is higher in threshold voltage than the fourth MIS transistor.

In accordance with a fourth aspect of the present invention, a constant voltage generating circuit comprises first to third current flow paths. The first current path includes a serial combination of a diode-coupled first MIS transistor of a first conductivity type, a second MIS transistor of a second conductivity type, and a first resistor. The second current path includes a serial combination of a third MIS transistor of the first conductivity type which is current mirror-connected to the first MIS transistor and a diode-coupled fourth MIS transistor of the second conductivity type. The third current path includes a fifth MIS transistor of the first conductivity type as current mirror-connected to the first MIS transistor. The second and fourth MIS transistors have their gates connected together. The third current path is associated with a constant voltage output unit as connected thereto. This unit is made up of a connection of a diode-coupled sixth MIS transistor and a second resistor. The second resistor has a resistance value greater than the turn-on resistance value of the sixth MIS transistor.

In accordance with a fifth aspect of the invention, a constant voltage generating circuit comprises first to third current flow paths. The first current path includes a serial combination of a diode-coupled first MIS transistor of a first conductivity type, a second MIS transistor of a second conductivity type, and a first resistor. The second current path includes a serial combination of a third MIS transistor of the first conductivity type as current mirror-connected to the first MIS transistor and a diode-coupled fourth MIS transistor of the second conductivity type. The third current path includes a fifth MIS transistor of the first conductivity type as current mirror-connected to the first MIS transistor. The second MIS transistor and the fourth MIS transistor have their gates connected together. The third path is operatively associated with a constant voltage output unit as connected thereto. This unit includes a diode-coupled sixth MIS transistor lower in transconductance than the fourth MIS transistor.

In accordance with a sixth aspect of the invention, a constant voltage generating circuit comprises first to third current flow paths. The first current path includes a serial combination of a diode-coupled first MIS transistor of a first conductivity type, a second MIS transistor of a second conductivity type, and a first resistor. The second current path includes a serial combination of a third MIS transistor of the first conductivity type as current mirror-connected to the first MIS transistor and a diode-coupled fourth MIS transistor of the second conductivity type. The third current path includes a fifth MIS transistor of the first conductivity type as current mirror-connected to the first MIS transistor. The second and fourth MIS transistors have their gates connected together. A constant voltage output unit is connected to the third current path. This constant voltage output unit includes a diode-coupled sixth MIS transistor. A third current flowing in the third current path is greater in magnitude than a second current flowing in the second current path.

These and other objects, features and advantages of the invention will be apparent from the following more particular description of embodiments of the invention, as illustrated in the accompanying drawings.

BRIEF DESCRIPTION OF THE DRAWINGS

FIG. 1A is a circuit diagram illustrating a basic configuration of circuitry embodying the present invention; FIGS. 1B to 1E are graphs showing current-versus-voltage characteristics thereof; and FIG. 1F is an alternative of the circuit as shown in FIG. 1A.

FIG. 8B is a waveform diagram.

DETAILED DESCRIPTION OF THE INVENTION

Figure 2A:
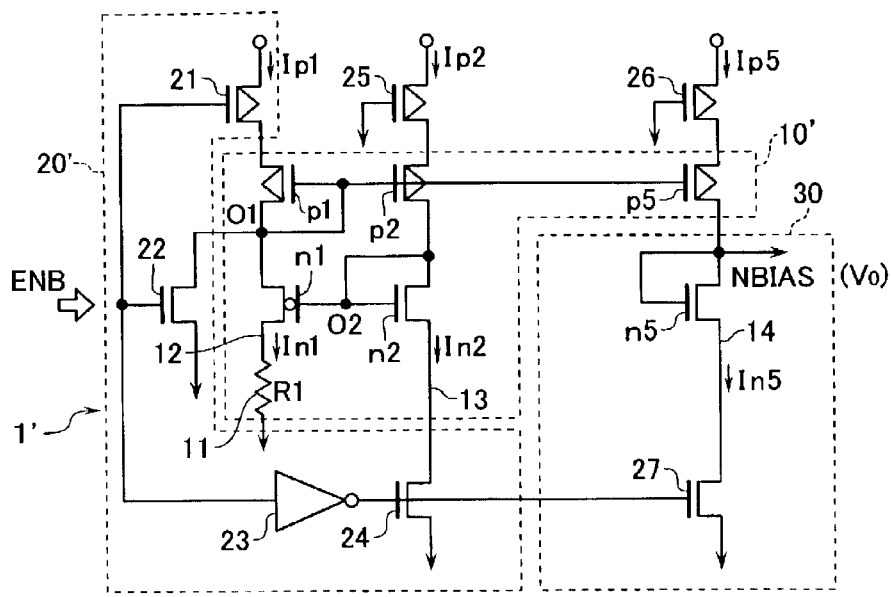
FIG. 2A is a diagram depicting a configuration of a constant-level voltage generation circuit in accordance with a first embodiment of this invention.

Several embodiments of the present invention will be set forth in detail with reference to the accompanying figures of the drawing below.

A principal configuration of constant-level voltage generating circuitry embodying the invention is shown in FIG. 1A, which is generally configured from a constant current generating circuit 10, a constant current generating circuit 40, and a voltage generating circuit 30.

The constant current generator circuit 10 includes n-channel metal oxide semiconductor (nMOS) transistors n1 and n2. These nMOS transistors n1, n2 are connected together at their gates. Sources or drains of transistors n1, n2 are designed to permit flow of a current of the same magnitude In1, In2. Transistors n1–n2 have threshold voltages that are set at different values. Due to the difference in the threshold voltages, an output current control signal I1 of the constant current generator circuit 10 is determinable by a cross point C of the current-versus-voltage characteristics of the both transistors as shown in FIG. 1B. This constant current generator circuit 10 also outputs a constant voltage V1.

Instead of making threshold voltage of the both transistor n1 and n2 have different values, transconductance values of the both transistor n1 and n2 can be different so that the cross point C in FIG. 1B can be determined by the difference of the transconductance values.

The constant current generator circuit 40 is operable to generate a constant current I2 that is proportional to the output current control signal I1. The constant voltage output unit 30 is equipped with a diode-connected nMOS transistor n3, which has its current-voltage characteristics with a current simply increasing with an increase in source-drain voltage (i.e., it has a positive gradient). Transistor n3 is designed so that the constant current I2 flows therein. Thus, the constant voltage output unit 30 operates to output a voltage Vo that is determined by the current-voltage characteristics (indicated by "In3" in FIG. 1C) of the transistor n3 and the constant current I2. This output voltage Vo is designable to satisfy the relation of Vo>V1 through appropriate choice of, for example, the magnitude of current I2, or the current-voltage characteristics of constant voltage output unit 30.

For instance, as shown in FIG. 1B, the transistor n3 is made equal in characteristics to the transistor n2. Letting the constant current generator circuit 40 flow a current I2 that is two times greater in magnitude than the output current control signal I1, it is possible to increase the output voltage Vo higher than V1. Alternatively as shown in FIG. 1C, letting transistor n3 be greater in threshold voltage than transistor n2 while causing constant current generator circuit 40 to flow a current I2 two times greater than output current I1, enables output voltages Vo to become further higher than V1 when compared to the case of FIG. 1B. Still alternatively, as shown in FIG. 1D, letting transistor n3 be less in transconductance than transistor n2 while causing constant current generator circuit 40 to flow a current I2 two times greater than output current control signal I1, enables output voltage Vo to become further higher than obtained in the case of FIG. 1B. In another further example shown in FIG. 1E, constant current generator 40 is arranged to flow the same current I2 as current control signal I1 while letting transistor n3 differ in characteristics (such as threshold voltage or conductance) from transistor n2. With such an arrangement also, it is possible to permit output voltage Vo to be greater than V1.

It should be noted that this output voltage Vo is determined exclusively by the magnitude of the constant current I2 and the characteristics of constant voltage output unit 30, and is not dependent upon the power supply voltage Vcc. That is, output voltage Vo is "independent" of supply voltage Vcc. Thus, it is possible to maintain output voltage Vo at higher potential levels even when supply voltage Vcc drops down in potential.

An explanation will next be given of some practically implementable examples of circuitry for achievement of the constant voltage generation circuit incorporating the principles of the invention, with reference to FIGS. 2A through 7B in this order of sequence.

First Embodiment

Figure 2B:
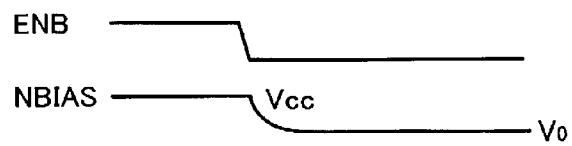
FIG. 2B is a waveform diagram thereof.
Figure 2C:
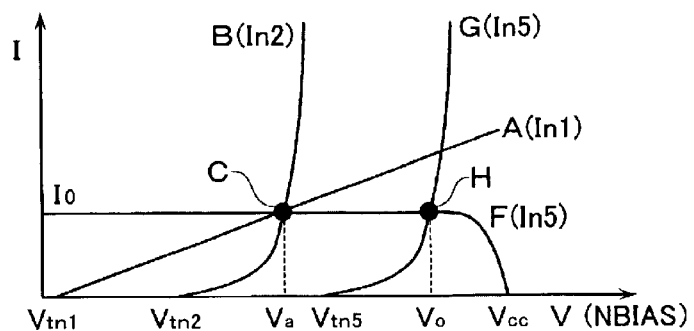
FIG. 2C is a graph showing current-voltage characteristics of the embodiment circuit of FIG. 2A.

FIGS. 2A to 2C show a first embodiment of the instant invention.

Figure 9A:
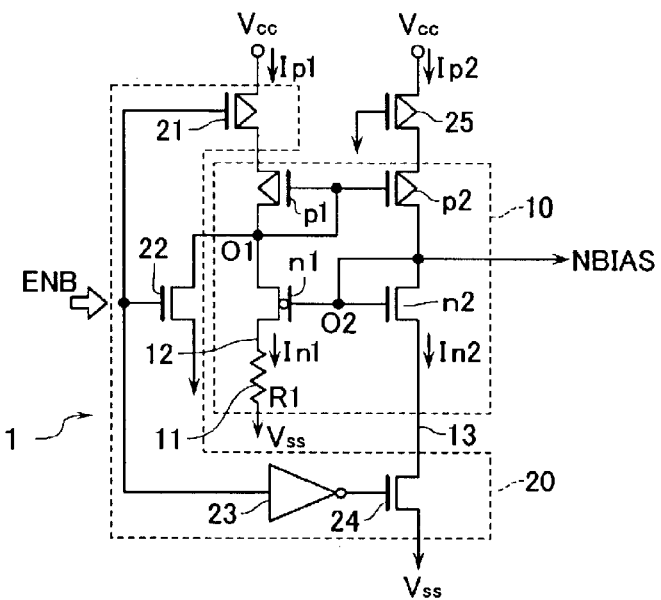
FIG. 9A shows a configuration of one prior art constant voltage generation circuit.
Figure 9B:
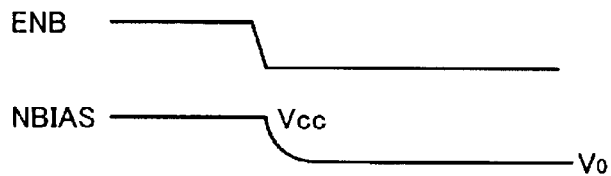
FIG. 9C is graph showing its current-voltage characteristics.

As shown in FIG. 2A, a constant voltage generation circuit 1' embodying the invention is generally constituted from a constant current generator circuit 10', a switching circuit 20', and a constant voltage output unit 30'. While the constant current generator circuit 10' is similar to the prior art constant current generator circuit 10 shown in FIG. 9 in that it employs nMOS transistors n1, n2 and pMOS transistors p1, p2. The constant current generator circuit 10' is different from the circuit 10 of FIG. 9 in that the former includes a third current flow path 14 in addition to the first current flow path 12 and second current flow path 13. This constant current generator 10' offers two functions: the function of constant current generator 10 of FIG. 1A, and that of the constant current generator 40.

The third current flow path 14 is generally made up of a pMOS transistor p5 with current mirror connection—say, current mirror-connected—to the pMOS transistors p1–p2, and a constant voltage output unit 30 as connected thereto.

The voltage generator unit 30 is configured from a diode-coupled nMOS transistor n5 and a switching transistor 27 which is used to turn the current flow path 14 on and off. A drain potential NBIAS of this transistor n5 is for use as an output voltage Vo of the constant voltage generation circuit 1'. Transistor n5 has a threshold voltage Vtn5 that is greater than the threshold voltage Vtn2 of the transistor n2 and also has its current-voltage (I–V) characteristics with a current simply increasing with an increase in source-drain voltage (i.e. it is positive in gradient).

The switching transistor 27 is operatively responsive to receipt of an enable signal ENB and turns on and off at the same time that respective transistors 21, 22, 24 of the switching circuit 20' turn on and off. Note that as shown in FIG. 2A, a gate-grounded transistor 26 similar in characteristics to the transistor 25 is connected between the source of transistor p5 and the power supply voltage Vcc. This transistor 26 functions to perform equalization of the source voltages of transistors p1–p2 and p5. In addition, with the illustrative embodiment, a potential difference between the transistor threshold voltages Vtn1 and Vtn2 is minimized to thereby minimize a potential level at a common gate (connection node O2) of transistors n1–n2. This is in order to guarantee establishment of the minimum value Vccmin of the supply voltage, which is lower than the prior art as discussed previously in the introductory part of the description in conjunction with FIGS. 9A–9C.

An operation of the constant voltage generation circuit 1' shown in FIG. 2A is as follows. Upon input of the enable signal ENB, each transistor 21, 22, 24 of the switch circuit 20' and transistor 27 of the voltage generator unit 30 is driven to turn on, causing the constant current generator circuit 10' to perform a switching operation in such a way as to change from its inactive state to active state.

Owing to the transistors p1–p2 and p5 making up the current mirror circuit, currents flowing in these transistors become equal in magnitude.

Figure 9C:
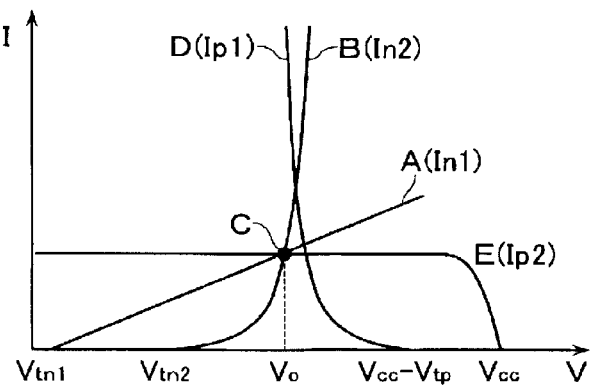

As shown in a graph of FIG. 2C, a potential level Va at the node O2 whereat the gates of transistors n1–n2 are connected together is determinable by the cross point C between the I–V characteristic curve "A" of current In1 and the I–V characteristic curve B of current In2, as in the prior art shown in FIG. 9C.

The current flow path 14 has its load characteristics as indicated by curve F in the graph of FIG. 2C. On the other hand, the diode-coupled transistor n5 exhibits a relation between the drain voltage and current In5 thereof, which is indicated by exponential curve G in FIG. 2C. This curve G starts with a threshold voltage Vtn5 plotted on the lateral axis of the FIG. 2C graph. These two curves F and G cross together at point H, which is used to determine the potential level of a connection node NBIAS to be handled as an output voltage, thus determining the significance of output voltage Vo.

As apparent from viewing FIG. 2C also, potentially reducing the voltage Va equivalent to the final output voltage Vo of the prior art (FIGS. 9A–C) enables the Vccmin value indicated by Formula 1 to decrease accordingly. Thus it is possible even when the supply voltage Vcc decreases to maintain the output voltage Vo at higher potential levels as compared to the case of the prior art.

Figure 2D:
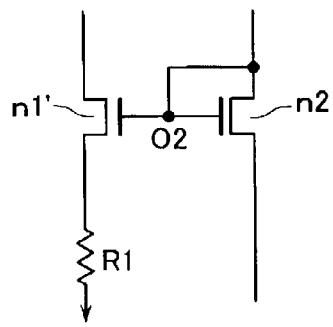
FIG. 2D is an alternative of the circuit as shown in FIG. 2A.

As shown in FIG. 2D, transistor n1' whose threshold voltage is made equal to that of the transistor n2 and whose transconductance is larger than that of the transistor n2 can be employed instead of transistor n1 having a low threshold voltage as shown in FIG. 2A. With this arrangement, the characteristic shown in FIG. 2C can be acquired. These transistor n1' and n2 can be realized by equalizing channel length of the both transistor n1' and n2 and making channel width W1 of transistor n1' wider than channel width W2 of transistor n2.

Second Embodiment

Figure 3A:
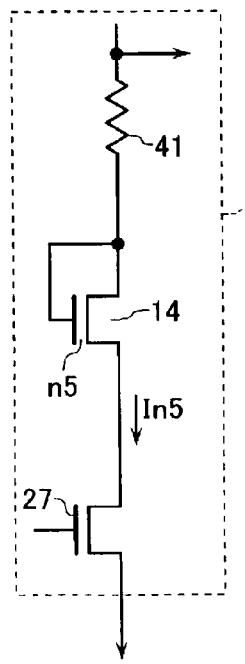
FIGS. 3A to 3C are diagrams each showing a configuration of a constant voltage generation circuit in accordance with a second embodiment of the invention.

While in the above-stated first embodiment the threshold voltage Vtn5 of transistor n5 is set higher than the threshold voltage Vtn2 of transistor n2, a second embodiment is arranged so that the threshold voltage Vtn5 is made equal to threshold voltage Vtn2 with a resistor 41 being connected between the drain of transistor n5 and the transistor p5 as shown in FIG. 3A. Resistor 41 has a resistance value R2, which is sufficiently greater than the turn-on resistance of transistor n5. With such an arrangement, it is possible to obtain the intended output voltage Vo higher than Va by a degree corresponding to a potential drop of resistor 41. This in turn makes it possible to allow the current In5's characteristic curve G to become a straight line with a gradient of 1/R2.

Figure 3B:
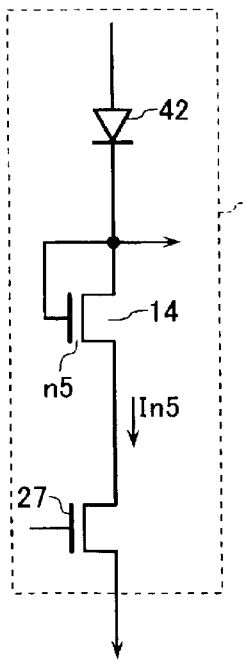

Alternatively, a diode 42 may be connected in a way as shown in FIG. 3B. In this case, the threshold voltage Vtn5 of transistor n5 may be set at the same value as the threshold voltage Vtn2 of transistor n2. Optionally the resistor 41 and diode 42 may be connected between the transistor n5 and transistor 27.

Figure 3C:
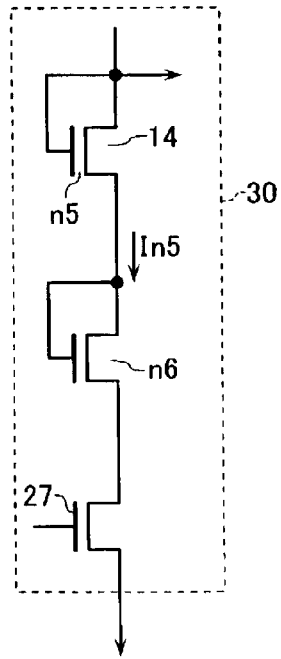

Still alternatively, as shown in FIG. 3C, a diode-coupled transistor n6 is series-connected to the transistor n5. This transistor may be replaced with more than two diode-coupled transistors that are serially coupled to transistor n5.

Third Embodiment

Figure 4:
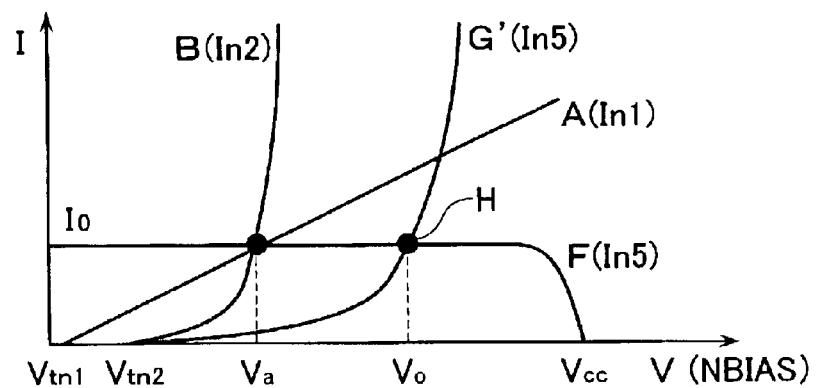
FIG. 4 is a graph showing the current-voltage characteristics of the constant voltage generator circuits in accordance with a third embodiment of the invention.
Figure 5:
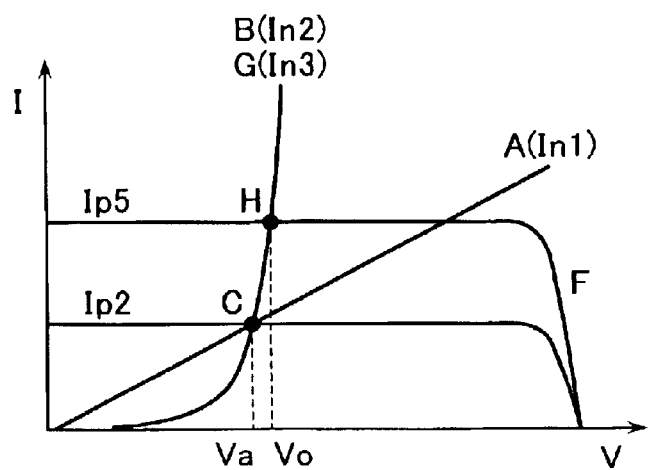
FIG. 5 is a graph showing the current-voltage characteristics of a constant voltage generation circuit in accordance with a fourth embodiment of the invention.

While in the first embodiment the threshold voltage Vtn5 of transistor n5 is made higher than the threshold voltage Vtn2 of transistor n2, a third embodiment is arranged so that the threshold voltages Vtn5 is made equal to Vtn2 while at the same time letting the transistor n5's transconductance gm5 be less than transconductance gm2 of transistor n2. With such an arrangement, as shown in FIG. 4, the on-the-lateral-axis plot point of a characteristic curve G' of the current In5 becomes identical to that of the curve B; however, curve G' becomes less than curve B in gradient. Due to this, it is possible to permit an output voltage Vo which is determined by the cross point H (operating point) relative to curve F to stay higher than the potential level Va at the connection node O2 in a similar way to that of the first embodiment stated supra.

Fourth Embodiment

While in the first embodiment the threshold voltage Vtn5 of transistor n5 is set higher than the threshold voltage Vtn2 of transistor n2, a fourth embodiment is such that the transistor n5 is made equal in characteristics to transistor n2 (see FIG. 5) while simultaneously changing the size of transistor p5 so that a current Ip5 is greater in magnitude than current Ip2. With such an arrangement, the output voltage Vo that is determined by the cross point H (operating point) relative to curve F may be kept higher than the potential level Va at the node O2, as in the first embodiment.

Fifth Embodiment

The above-stated first to third embodiments are faced with a problem as to circuit operation delays. In these embodiment, the curve G (G') of the current In5 of transistor n5 can decrease in gradient. This gradient decrease leads to an unwanted increase in length of a time period (transition time) spanning from a time point at which the constant voltage generation circuit 1' goes into its active state in response to the enable signal ENB up to an instant whereat the output voltage finally reaches Vo from its initial state Vcc. Such transition time increase would result in the circuit becoming slower or "decelerated" in operation.

Figure 6:
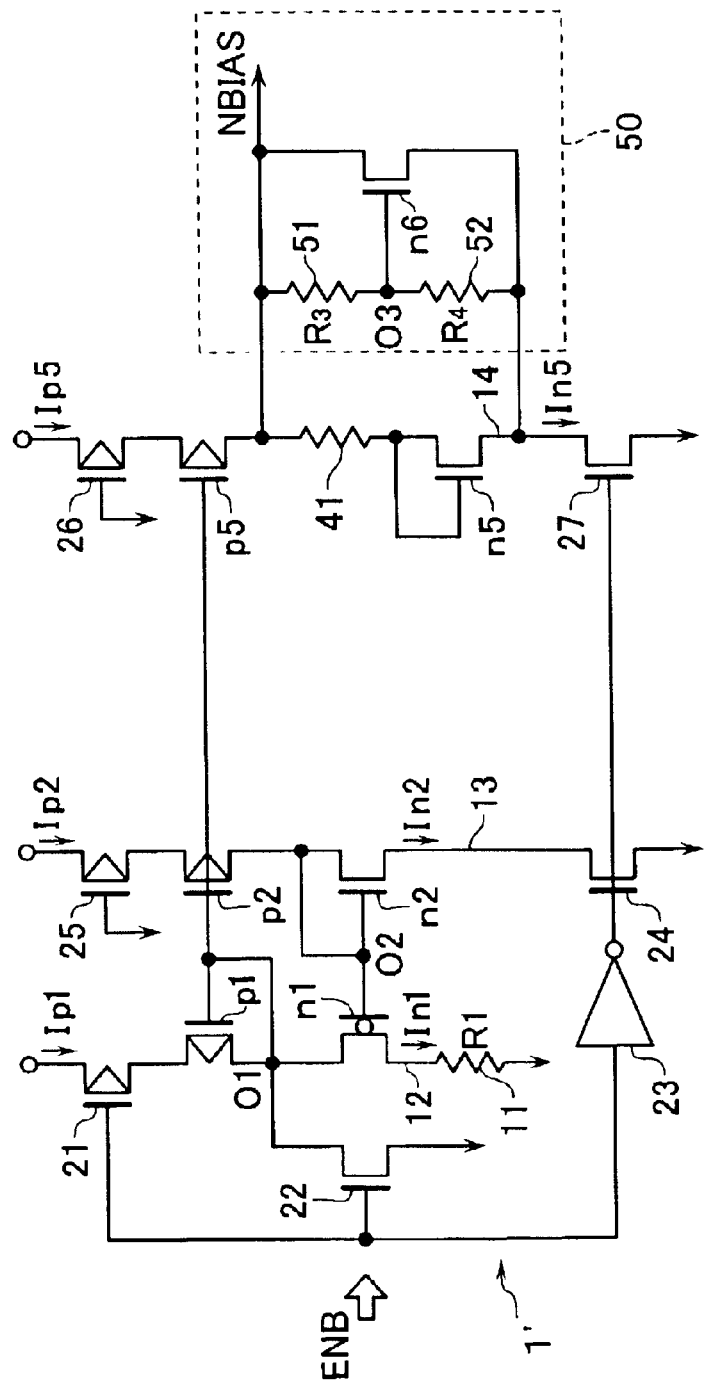
FIG. 6 is a diagram showing a configuration of a constant voltage generation circuit in accordance with a fifth embodiment of the invention.

To avoid the problem, this embodiment is arranged so that an acceleration circuit 50 is connected in parallel to the transistor n5 as shown in FIG. 6. The accelerator circuit 50 includes a serial combination of a resistor 51 (with a resistance value R3) and a resistor 52 (with a resistance value R4), and an nMOS transistor n6 which is connected in parallel to these resistors 51, 52. Transistor n6 has its gate connected to a connection node 03 of resistors 51–52. When the enable signal ENB potentially changes from "High" or "H" level to "Low" ("L") level, transistor n6 turns on causing electrical charge at an output terminal of the constant voltage output unit 30 to discharge to thereby shorten the transition time. In this respect, appropriate design must be done to ensure that no current flows in the resistors 51–52 and transistor n6 after the output voltage finally reaches the target potential level Vo. To this end, in this embodiment, a total resistance value, R3+R4, is specifically arranged so that it is sufficiently greater than the turn-on resistance of transistor n5. In addition, transistor n6 is designed so that it turns off once after the output voltage reaches or "converges" to Vo. Practically, let the transistor n6 have a threshold voltage Vtn6 which is given as:

$$Vtn6 VoxR4/(R3+R4). \text{[Formula 2]}$$

With the use of this value setting, it becomes possible to accurately control a switching operation of transistor n6 so that it turns off exactly at a time point whereat the output voltage becomes Vo.

Although one specific example with the accelerator circuit 50 added to the circuit of FIG. 3A is shown in FIG. 6, this accelerator 50 may alternatively be added to any one of the circuits of FIGS. 2A and 3B–C.

Utilization Example

An explanation will be given of a practically implemented example, which permits one of the constant voltage generation circuits in accordance with the first to fifth embodiment of the invention to be used in a semiconductor integrated circuit device.

In this part, an explanation will be given of a utilization example in which a constant voltage generating circuit according to the embodiment of the present invention is applied in a clamp circuit in a flash memory.

Figure 7:
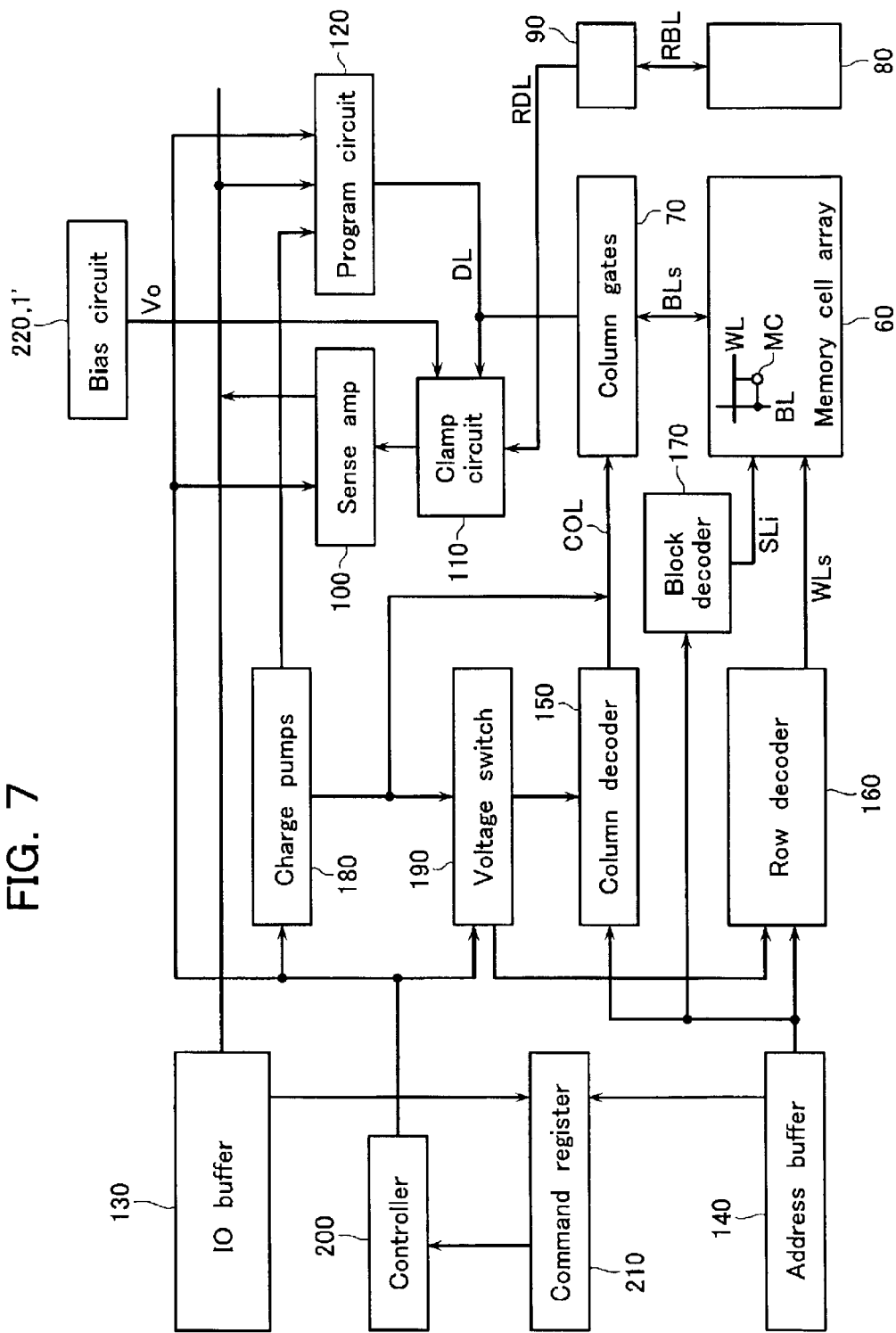
FIG. 7 is a block diagram showing an example of the configuration of a flash memory in which a constant voltage generating circuit according to the embodiments of the present invention can be applied.

One example of a configuration of a flash memory is explained with a block diagram shown in FIG. 7. In FIG. 7, the flash memory comprises memory cell array 60, column gate 70, reference cell array 80, dummy column gate 90, sense amplifier 100, clamp circuit 100, program circuit 120, IO buffer 130, address buffer 140, column decoder 150, row decoder 160, block decoder 170, charge pump circuit 180, voltage switch circuit 190, control circuit 200, command register 210, and bias circuit 220.

The memory cell array 60 comprises a plurality of word lines WLs, a plurality of bit lines BLs, and a plurality of memory cells MC provided on cross points of the word lines WLs and bit lines BLs. The column gate 70 serves to select a specific bit line BL in memory cell array 60 and is connected with column line COL for inputting signals selecting a specific bit line BL.

Reference cell array 80 is made up of reference bit line RBL, reference cells which is placed along the reference bit line RBL, and dummy cells.

Dummy column gate 90 is provided for equalizing memory cell array 60 and reference cell array 80 in capacitance.

Sense amplifier 100 serves to compare the readout potential of memory cell array 60 and readout potential of reference cell array 80 and to read out the data in memory cell MC. Clamp circuit 110 provides maximum of potential at bit line BL and reference bit line RBL, based on the output voltage Vo from bias circuit 220. Program circuit 120 outputs writing voltage to the drain of memory cell MC when writing data in memory cell array 60. IO buffer 130 holds memory cell MC's data that is sensed by sense amplifier 100 in read mode, and holds write data and lets program circuit 120 output writing voltage in write mode.

Address buffer 140 is configured to hold address data of a memory cell subject to writing or reading and to output these address data to column decoder 150 and low decoder 160.

Column decoder 150 decodes column address data in the address data and selects a column line COL. Low decoder 160 decodes Low address data in the address data and selects a word line WL.

Block decoder 170 decodes block address data for selecting a memory cell block out of plural memory cell blocks in memory cell array 60, and selects a specific block based on the decode output.

Charge-pump circuit 170 generates each voltage for reading, writing or deleting data in memory cell MC. Voltage switch circuit 190 transfers reading voltage, writing voltage and deleting voltage which have been generated in charge pump circuit 180 to column decoder 150 and low decoder 160 on the basis of control signal from control circuit 200.

Command register 210 holds inputted commands such as readout command, write command, and delete command.

Constant voltage generating circuit 1' according to the embodiments of the present invention can be utilized for b bias circuit 220.

Figure 8A:
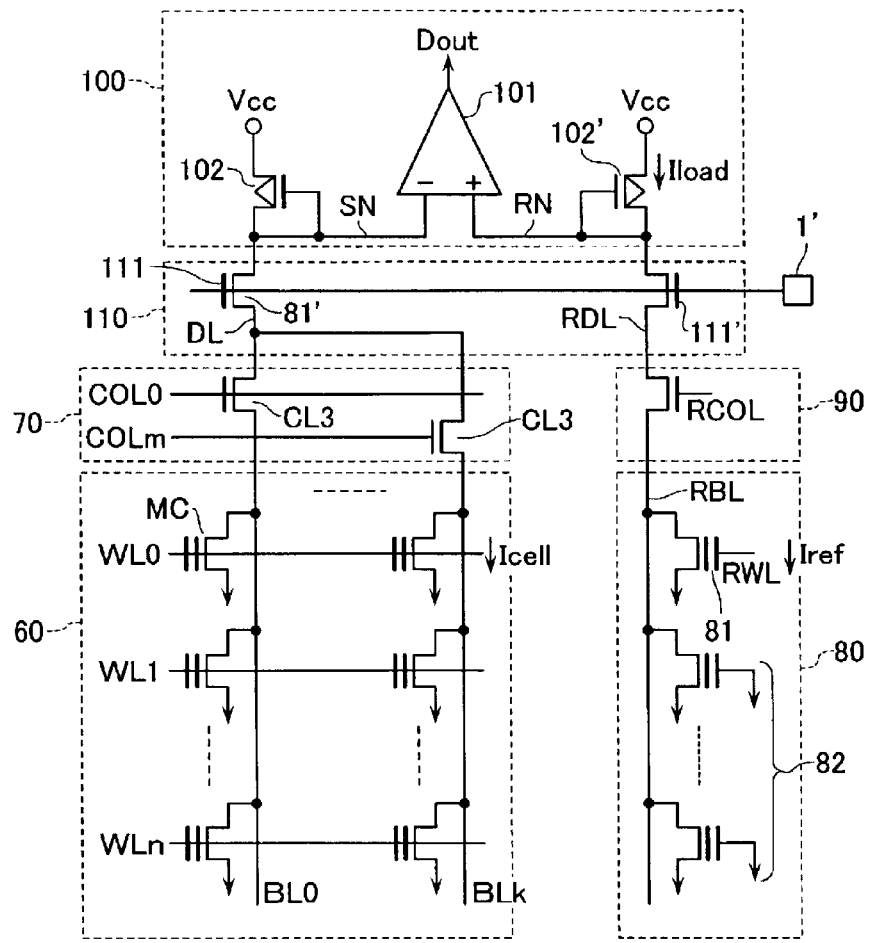
FIG. 8A shows an exemplary configuration of main part of a flash memory of the NOR cell type incorporating therein the constant voltage generation circuit in accordance with the embodiment of the present invention.

FIG. 8A shows one example of concrete configuration of cell array 60, column gate 70, reference cell array 80, dummy column gate 90, sense amplifier 100, and clamp circuit 110.

As shown in FIG. 8A, the memory cell array 60 is configured from a plurality of parallel word lines WL0, WL1, . . . , WLn (n is an integer), a plurality of parallel bit lines BL0, BL1, . . . , BLk (k is an integer), and a plurality of memory cells MC provided at cross points or intersections of these word lines and bit lines. The column gate 70 includes transistors CL3 and column lines COL0, . . . , COLm (m is an integer) for input of a signal which selects a specific bit line BL.

The reference cell array 80 comprises a reference cell 81 storing therein a reference potential level and dummy cells 82. The reference cell 81 and dummy cells 82 are disposed along a reference bit line RBL. Reference cell 81 is selected by a reference word line RWL and a reference column line RCOL which extends from dummy column gate 90. Dummy cells 82 are provided for capacitance equalization of bit lines BL and reference bit line RBL. Whereby, reference cell array 80 generates a current Iref that is used as a reference for determination of the magnitude of a cell current Icell flowing in a presently selected memory cell MC.

The dummy column gate 90 is provided for capacitance equalization between the memory cell array 60 and reference cell array 80.

The sense amplifier 100 includes an operational amplifier 101 and load transistors 102, 102'. The load transistors 102, 102' are connected between the power supply voltage Vcc and clamp transistors 111, 111' to be later described. Each transistor has its gate and drain coupled together, thus functioning as a current source load.

The clamp circuit 110 includes the clamping transistors 111, 111' which receive at their gates an output voltage Vo of any one of the constant voltage generation circuits 1' of the first to fourth embodiments stated supra. Whereby, an upper limit potential level of the bit lines BL, RBL is suppressed to stay at a difference Vo–Vtc between the output voltage Vo of constant voltage generation circuit 1' and the threshold voltage Vtc of clamp transistors 111, 111'.

Figure 8B:
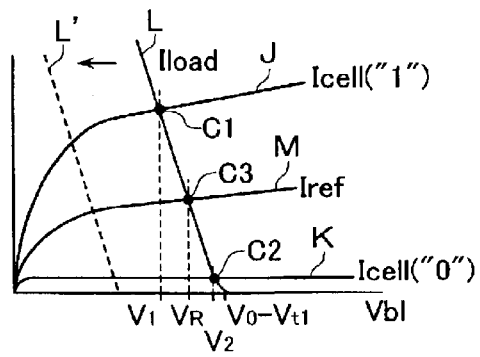
FIG. 8B is a graph showing current-voltage characteristics of it.

In the arrangement above, in case the selected memory cell MC is subject to data reading, the I–V characteristics of a cell current Icell flowing in a bit line BL is indicated by curve J shown in FIG. 8B when the data to be stored in the memory cell is a logic "1." When the data is a "0," the same is represented by curve K in FIG. 8B.

On the other hand, a load current Iload flowing in the transistor 111, 111' of clamp circuit 110 becomes as shown by curve L in FIG. 8B. Due to this, if the data the selected memory cell MC stores therein is a "1," then a voltage at a sense node SN of the op-amp 101 becomes a voltage V1 as represented by a cross point C1 between curves J and L. Alternatively, if the data stored in the selected memory cell MC is a "0" then the voltage at the sense node SN of op-amp 101 becomes a voltage V2 as represented by a cross point C2 between curves K and L.

Additionally a reference current Iref flowing in the reference cell array 80 is represented by curve M in FIG. 8B. A voltage at a reference node RN of the op-amp 101 becomes a voltage VR which is represented by a cross point C3 between curves M and L. The op-amp 101 is operable to detect whether an input voltage of the sense node SN is greater or less than the voltage VR to thereby determine whether the stored data of selected memory cell MC is a "1" or "0."

Incidentally in the NOR-cell flash memory shown in FIG. 8A, the cells gradually change in threshold voltage through repeated execution of read operations which set them in a weak write mode. For instance, if this memory is designed to offer the proper data-read operability for ten years, then it is desirable that the bit line voltage VBL be kept at 1.5 volts (V) or below. This voltage setting is achieved by use of the clamp transistors 111, 112. However, when the supply voltage Vcc decreases in potential resulting in a likewise decrease in output voltage Vo of the constant voltage generation circuit 1', the read time gets longer, causing the memory to decrease in performance.

In accordance with the constant voltage generation circuit 1' in accordance with the invention, even when the power supply voltage Vcc decreases, it is no longer required to reduce the output voltage Vo. Thus it is possible to increase the cell current Icell up to a sufficient magnitude, thereby enabling successful preclusion of any unwanted increase in read time.

In FIG. 8A, MOS transistors are employed as memory cells MC. However, other semiconductor devices can be utilized for memory cells MC. For example, MNOS cells, MONOS cells, MRAM cells, or phase-transition cells can be employed. When Either of these exemplified cells are used as memory cells MC, bit line voltage must be clamped in order to prevent the bit line voltage from becoming too high in readout mode, in order to maintain data reliability. Therefore, also in these cases, clamp circuit shown in FIG. 8A is effective.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A constant voltage generating circuit, comprising:
   a first current path including a serial combination of a diode-coupled first MIS transistor of a first conductivity type, a second MIS transistor of a second conductivity type, and a first resistor;
   a second current path including a serial combination of a third MIS transistor of the first conductivity type as current mirror-connected to said first MIS transistor and a diode-coupled fourth MIS transistor of the second conductivity type having a threshold voltage different than the threshold voltage of said second MIS transistor;
   a third current path including a fifth MIS transistor of the first conductivity type as current mirror-connected to said first MIS transistor;
   said second MIS transistor and said fourth MIS transistor having gates connected together; and
   a constant voltage output unit connected to said third current path, said constant voltage output unit including a diode-coupled sixth MIS transistor of a second conductivity type whose threshold voltage is higher than said fourth MIS transistor,
   wherein said first resistor has a resistance value greater than a turn-on resistance of said second MIS transistor.

2. A constant voltage generating circuit comprising:
   a first current path including a serial combination of a diode-coupled first MIS transistor of a first conductivity type, a second MIS transistor of a second conductivity type, and a first resistor;
   a second current path including a serial combination of a third MIS transistor of the first conductivity type as current mirror-connected to said first MIS transistor and a diode-coupled fourth MIS transistor of the second conductivity type having a threshold voltage different than the threshold voltage of said second MIS transistor;
   a third current path including a fifth MIS transistor of the first conductivity type as current mirror-connected to said first MIS transistor;
   said second MIS transistor and said fourth MIS transistor having gates connected together;
   a constant voltage output unit connected to said third current path, said constant voltage output unit including a diode-coupled sixth MIS transistor of a second conductivity type whose threshold voltage is higher than said fourth MIS transistor, and
   an acceleration circuit connected in parallel to said sixth MIS transistor for accelerating discharge of electrical charge at an output terminal of said constant voltage output unit.

3. The constant voltage generating circuit according to claim 2, wherein said acceleration circuit includes a parallel combination of a voltage dividing resistor and a seventh MIS transistor for inputting to its gate an output voltage of the voltage dividing resistor.

4. A constant voltage generating circuit comprising:
   a first current path including a serial combination of a diode-coupled first MIS transistor of a first conductivity type, a second MIS transistor of a second conductivity type, and a first resistor;
   a second current path including a serial combination of a third MIS transistor of the first conductivity type as current mirror-connected to said first MIS transistor and a diode-coupled fourth MIS transistor of the second conductivity type having a threshold voltage different than the threshold voltage of said second MIS transistor;
   a third current path including a fifth MIS transistor of the first conductivity type as current mirror-connected to said first MIS transistor;

said second MIS transistor and said fourth MIS transistor having gates connected together; and a constant voltage output unit connected to said third current path, said constant voltage output unit including a diode-coupled sixth MIS transistor of a second conductivity type whose threshold voltage is higher than said fourth MIS transistor, wherein said first resistor has a resistance value greater than a turn-on resistance value of said second MIS transistor.

5. A constant voltage generating circuit comprising:

a first current path including a serial combination of a diode-coupled first MIS transistor of a first conductivity type, a second MIS transistor of a second conductivity type, and a first resistor;

a second current path including a serial combination of a third MIS transistor of the first conductivity type as current mirror-connected to said first MIS transistor and a diode-coupled fourth MIS transistor of the second conductivity Woe having a threshold voltage different than the threshold voltage of said second MIS transistor;

a third current path including a fifth MIS transistor of the first conductivity type as current mirror-connected to said first MIS transistor;

said second MIS transistor and said fourth MIS transistor having sates connected together;

a constant voltage output unit connected to said third current path, said constant voltage output unit including a diode-coupled sixth MIS transistor of a second conductivity type whose threshold voltage is higher than said fourth MIS transistor, and an acceleration circuit connected in parallel to said sixth MIS transistor for accelerating discharge of electrical charge at an output terminal of said constant voltage output unit.

6. The constant voltage generating circuit according to claim 5, said acceleration circuit includes a parallel combination of a voltage dividing resistor and a MIS transistor for inputting to its gate an output voltage of the voltage dividing resistor.

7. A constant voltage generating circuit, comprising:

a first current path including a serial combination of a diode-coupled first MIS transistor of a first conductivity type, a second MIS transistor of a second conductivity type, and a first resistor;

a second current path including a serial combination of a third MIS transistor of the first conductivity type as current mirror-connected to said first MIS transistor and a diode-coupled fourth MIS transistor of the second conductivity type having a threshold voltage different than the threshold voltage of said second MIS transistor;

a third current path including a fifth MIS transistor of the first conductivity type as current mirror-connected to said first MIS transistor;

said second MIS transistor and said fourth MIS transistor having gates connected together; and a constant voltage output unit connected to said third current path, said constant voltage output unit including a diode-coupled sixth MIS transistor lower in transconductance than said fourth MIS transistor, wherein said first resistor has a resistance value greater than a turn-on resistance of said second MIS transistor.

8. A constant voltage generating circuit comprising:

a first current path including a serial combination of a diode-coupled first MIS transistor of a first conductivity type, a second MIS transistor of a second conductivity type, and a first resistor;

a second current path including a serial combination of a third MIS transistor of the first conductivity type as current mirror-connected to said first MIS transistor and a diode-coupled fourth MIS transistor of the second conductivity type having a threshold voltage different than the threshold voltage of said second MIS transistor;

a third current path including a fifth MIS transistor of the first conductivity type as current mirror-connected to said first MIS transistor;

said second MIS transistor and said fourth MIS transistor having gates connected together;

a constant voltage output unit connected to said third current path, said constant voltage output unit including a diode-coupled sixth MIS transistor lower in transconductance than said fourth MIS transistor; and an acceleration circuit connected in parallel to said sixth MIS transistor for accelerating discharge of electrical charge at an output terminal of said constant voltage output unit.

9. The constant voltage generating circuit according to claim 8, wherein said acceleration circuit includes a parallel combination of a voltage dividing resistor and a MIS transistor for inputting to its gate an output voltage of the voltage dividing resistor.

10. A constant voltage generating circuit, comprising:

a first current path including a serial combination of a diode-coupled first MIS transistor of a first conductivity type, a second MIS transistor of a second conductivity type, and a first resistor;

a second current path including a serial combination of a third MIS transistor of the first conductivity type as current mirror-connected to said first MIS transistor and a diode-coupled fourth MIS transistor of the second conductivity type having a threshold voltage different than the threshold voltage of said second MIS transistor;

a third current path including a fifth MIS transistor of the first conductivity type as current mirror-connected to said first MIS transistor;

said second MIS transistor and said fourth MIS transistor having gates connected together; and a constant voltage output unit connected to said third current path, said constant voltage output unit including a diode-coupled sixth MIS transistor while letting a third current flowing in said third current path be greater than a second current flowing in said second current path, wherein said first resistor has a resistance value greater than a turn-on resistance of said second MIS transistor.

11. A constant voltage generating circuit comprising:

a first current path including a serial combination of a diode-coupled first MIS transistor of a first conductivity type, a second MIS transistor of a second conductivity type, and a first resistor;

a second current path including a serial combination of a third MIS transistor of the first conductivity type as current mirror-connected to said first MIS transistor and a diode-coupled fourth MIS transistor of the second conductivity type having a threshold voltage different than the threshold voltage of said second MIS transistor;

a third current path including a fifth MIS transistor of the first conductivity type as current mirror-connected to said first MIS transistor;

said second MIS transistor and said fourth MIS transistor having gates connected together;

a constant voltage output unit connected to said third current path, said constant voltage output unit including a diode-coupled sixth MIS transistor while letting a third current flowing in said third current path be greater than a second current flowing in said second current path; and an acceleration circuit connected in parallel to said sixth MIS transistor for accelerating discharge of electrical charge at an output terminal of said constant voltage output unit.

12. The constant voltage generating circuit according to claim 11, wherein said acceleration circuit includes a parallel combination of a voltage dividing resistor and a MIS transistor for inputting to its gate an output voltage of the voltage dividing resistor.

* * * * *